United States Patent [19]

Smith et al.

[11] 4,365,334
[45] Dec. 21, 1982

[54] ELECTRICAL TESTING APPARATUS AND METHODS

[75] Inventors: Anthony J. Smith, Penn; Timothy J. Sheppard, Pinner, boh of England

[73] Assignee: Racal Automation Limited, Bracknell, England

[21] Appl. No.: 232,665

[22] Filed: Feb. 9, 1981

[30] Foreign Application Priority Data

Feb. 27, 1980 [GB] United Kingdom ............... 8006607

[51] Int. Cl.³ .......................................... G01R 31/28
[52] U.S. Cl. .................................... 371/27; 324/73 R; 371/20
[58] Field of Search ............................ 371/27, 20, 25; 324/73 R, 73 AT, 73 PC

[56] References Cited

U.S. PATENT DOCUMENTS

| | | | |
|---|---|---|---|
| 4,097,797 | 6/1978 | Finet | 324/73 R |
| 4,168,527 | 9/1979 | Winkler | 371/20 |
| 4,204,633 | 5/1980 | Goel | 371/27 |
| 4,216,539 | 8/1980 | Raymond et al. | 371/20 |
| 4,228,537 | 10/1980 | Henckels et al. | 371/20 |
| 4,236,246 | 11/1980 | Skilling | 371/27 |
| 4,287,594 | 9/1981 | Shirasaka | 371/27 |

*Primary Examiner*—Charles E. Atkinson
*Attorney, Agent, or Firm*—Leydig, Voit, Osann, Mayer & Holt, Ltd.

[57] ABSTRACT

A system is disclosed for generating test data for testing logic circuits. It has a store storing a respective Logic List for each of the basic logic circuit types in the form of a list of logic states identifying terminals of the logic circuit to which specified data inputs are to be applied and terminals at which specified data outputs are expected.

Another store generates connection information relating to a particular logic circuit under test and specifies any external conditions applied to that circuit by means of its terminals which modify its operation. Means are provided which then modify the logic states of the Logic List in dependence on the connection information, so as to produce a final set of test data which can be used immediately, or subsequently, to carry out the tests on the particular logic circuit.

10 Claims, 6 Drawing Figures

ELECTRICAL TESTING APPARATUS AND METHODS

BACKGROUND OF THE INVENTION

The invention relates to methods and apparatus for the automatic testing of electrical and electronic circuitry. More specifically, it relates to the testing of logic circuits. For example, the methods and apparatus to be more specifically described can be used for applying test signals to a logic circuit and to determine, from the resultant outputs produced by the circuit, whether the circuit is operating correctly and, if not, which part is faulty. The logic circuits to be tested may be in integrated circuit form.

The invention applies not only to "in-circuit" testing of individual logic circuits of a circuit board but also to the testing of a complete board or part of a board via its edge connections.

SUMMARY OF THE INVENTION

According to the present invention, there is provided a system for generating test data for testing any one of a plurality of predetermined logic circuits, comprising a store for storing for each of the basic logic circuit types data in the form of a respective list of logic states each logic state identifying one or more particular terminals of the logic circuit to which specified data inputs are to be applied and one or more particular terminals at which specified data outputs are to be produced if the logic circuit is operating correctly, means for generating connection information relating to a particular logic circuit (of one of the basic types) to be tested and specifying any external conditions applied to that circuit by means of its terminals, and modifying means operative to modify the logic states in the stored list for that logic circuit in dependence on the connection information whereby to produce the said test data.

According to the present invention, there is also provided a system for generating test data for testing any one of a plurality of predetermined basic types of logic circuits, comprising a store for storing, for each of the basic logic circuit types, data in the form of a respective list of logic states each logic state identifying one or more particular terminals of the logic circuit to which specified data inputs are to be applied and one or more particular terminals at which specified data outputs are to be produced if the logic circuit is operating correctly, an array of discrete contact means mounted in predetermined physical relationship with each other whereby when the array and a particular logic circuit under test are brought into juxtaposition each discrete contact means makes contact with one or more particular terminals of the logic circuit in dependence on the particular basic type of the logic circuit, means storing for each particular logic circuit to be tested connection data which specifies for each particular one of the discrete contact means the identity of the corresponding terminal of the logic circuit and, in addition, the identity of any other terminal of that logic circuit which may also be connected to the same discrete contact means by an external connection applied to that logic circuit, control means operative in response to a particular logic circuit to be tested to read out each logic state of the stored list of logic states corresponding to that basic logic circuit type and to compare each such logic state with the connection data whereby, unless inhibited for any such logic state, to identify the discrete contact means corresponding to the particular terminals specified and the data inputs and outputs to be applied to, or produced from, those contact means as specified by that logic state, inhibiting means operative to inhibit the contact means when the connection data indicates that two or more terminals of the logic circuit under test are interconnected by an external connection in a manner conflicting with the requirement of a particular logic state, and output means responsive to the said discrete contact means and the data inputs and outputs as identified by the control means to generate the said test data.

According to the present invention, there is further provided a method for generating test data for testing any one of a plurality of logic circuits, comprising the steps of storing for each of the basic logic circuit types data in the form of a respective list of logic states, each logic state identifying one or more particular terminals of the logic circuit to which specified data inputs are to be applied and one or more corresponding terminals at which specified data outputs are to be produced if the logic circuit is operating correctly, generating connection information relating to a particular logic circuit (of one of the basic types) to be tested and specifying any external conditions applied to that circuit by means of its terminals, and modifying the logic states in the stored list for that logic circuit in dependence on the connection information whereby to produce the said test data.

DESCRIPTION OF THE DRAWINGS

Automatic test equipment embodying the invention and automatic testing methods according to the invention, will now be described with reference to the accompanying drawings in which.

DESCRIPTION OF PREFERRED EMBODIMENTS

Figure 1:
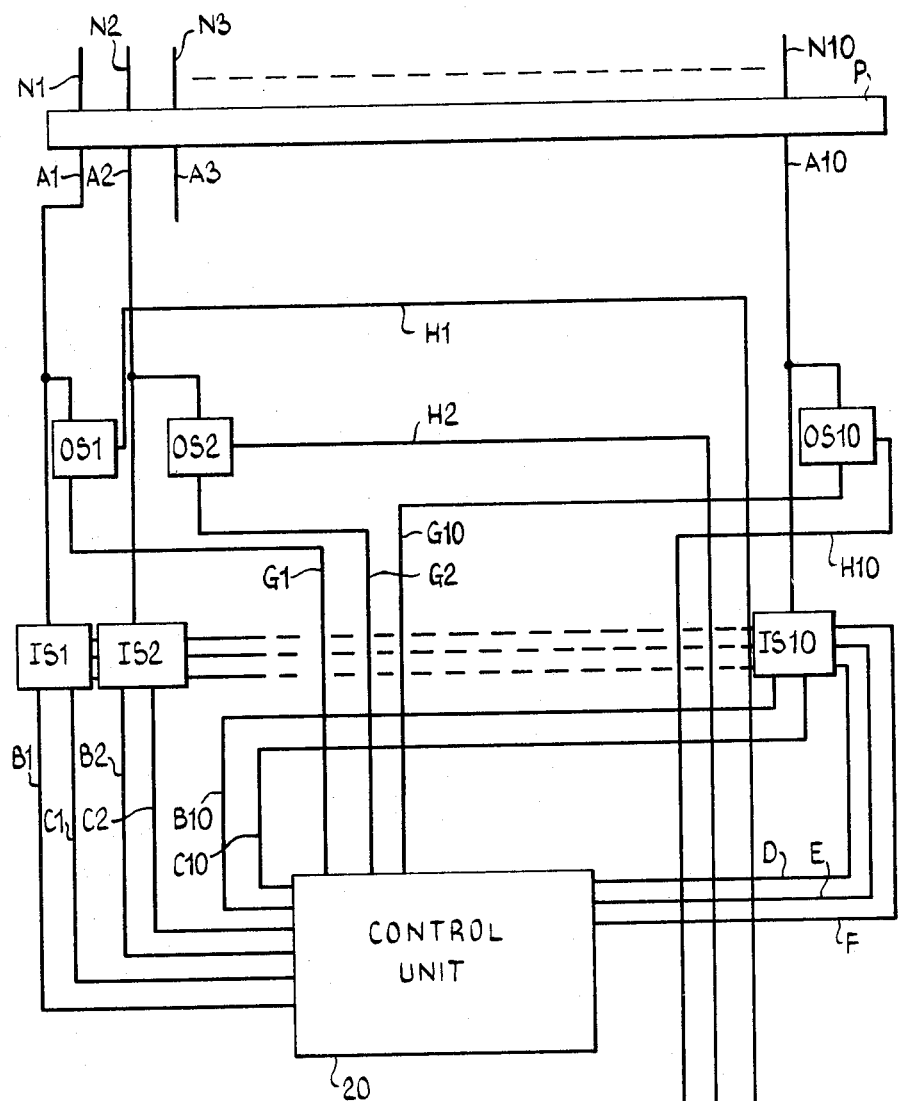
FIG. 1 is a simplified circuit diagram of part of the apparatus.

As shown in FIG. 1, the apparatus comprises a contact plate P from which project ten (in this example) test needles N1 to N10 which are spring-loaded, electrically insulated from each other, and have sharp points so as to make good electrical contact with the respective parts of the circuit to be tested when the contact plate P, and a circuit board carrying the circuit to be tested, are mounted together in a suitable mounting jig. Normally, there is one test needle for each circuit node.

Each needle is connected by a respective line A1, A2 . . . A10 to a respective input switch and a respective output switch. Thus, needle N1 is connected by its line A1 to input switch IS1 and output switch OS1, needle N2 is connected by its line A2 to input switch IS2 and output switch OS2, and so on for the remaining needles. For simplicity, not all the switches are shown in FIG. 1.

Each input switch IS has two enabling lines B1, B2 ... B10 and C1, C2 ... C10 which are individually connected to a test control unit 20. In addition, all input switches IS are connected in common to the central control unit 20 by a common control line D, a common binary HIGH line E and a common binary LOW line F.

Each output switch has a respective control line G1, G2 ... G10 connected to the test control unit 20 and a respective output line H1, H2 ... H10 which is connected to an output unit 22.

In FIG. 1, only needles N1, N2 and N10 are shown and only the input and output switches and connections for those needles.

In operation, as so far described, the logic circuit to be tested and the plate P are fixed together in the jig referred to above, so that the test needles make contact with predetermined ones of the nodes of the logic circuit. Binary signals are then applied to certain nodes of the logic circuit by respective ones of the test needles N1, N2, N3 ... N10. In order to do this, the test control unit 20 energises the enabling line B or C of the appropriate input switch IS. This operation in itself does not energise the test needles N1, N2, N3 ... N10. However, when, thereafter, the line D is momentarily pulsed, those input switches which have their lines B enabled are switched to the binary HIGH level of line E while those input switches which have their lines C energised are switched to the binary LOW level of line F. In each case, the respective binary level is transmitted by the respective line A to the corresponding test needle and thus to the corresponding terminals on the logic circuit. Those input switches which have neither their lines B nor their lines C energised do not react when the line D is pulsed, and their output lines A, and thus the corresponding test needles, remain at a floating level.

In carrying out such a test on a logic circuit, some, only, of the test needles N1, N2, N3 ... N10 would be energised in the manner explained above, thus providing input signals to the logic circuit. One or more of the other needles would be used to pick up the output signal or signals produced by the logic circuit in response to the input signals. The output switches OS of these latter test needles would therefore be closed (by signals on their lines G) so as to feed the resultant output signals back to the output unit 22 by means of the lines H, where the signals are checked to see whether or not they have the correct values.

The arrangement as described can be used for testing logic circuits while they are connected up to other logic circuits. In order to prevent the application of the test signals to the logic circuit under test from adversely affecting or damaging other logic circuits to which the logic circuit under test is connected, the test signals applied by the test needles can be made to be of very short duration (say 10 uS). However, as will be explained later, the apparatus can also be used to test a complete circuit board via its edge connectors, and in this case the need for very short duration pulses is obviated.

The foregoing is a simplified description of this part of the apparatus. For a fuller description, reference is made to British Application Ser. No. 34,571/78 (published under Ser. No. 2,029,032) and to the corresponding U.S. Application Ser. No. 69,043 filed Aug. 23rd, 1979 and now U.S. Pat. No. 4,271,516, French Application Ser. No. 7921410 and German Application Ser. No. P2934285.6.

Figure 2:
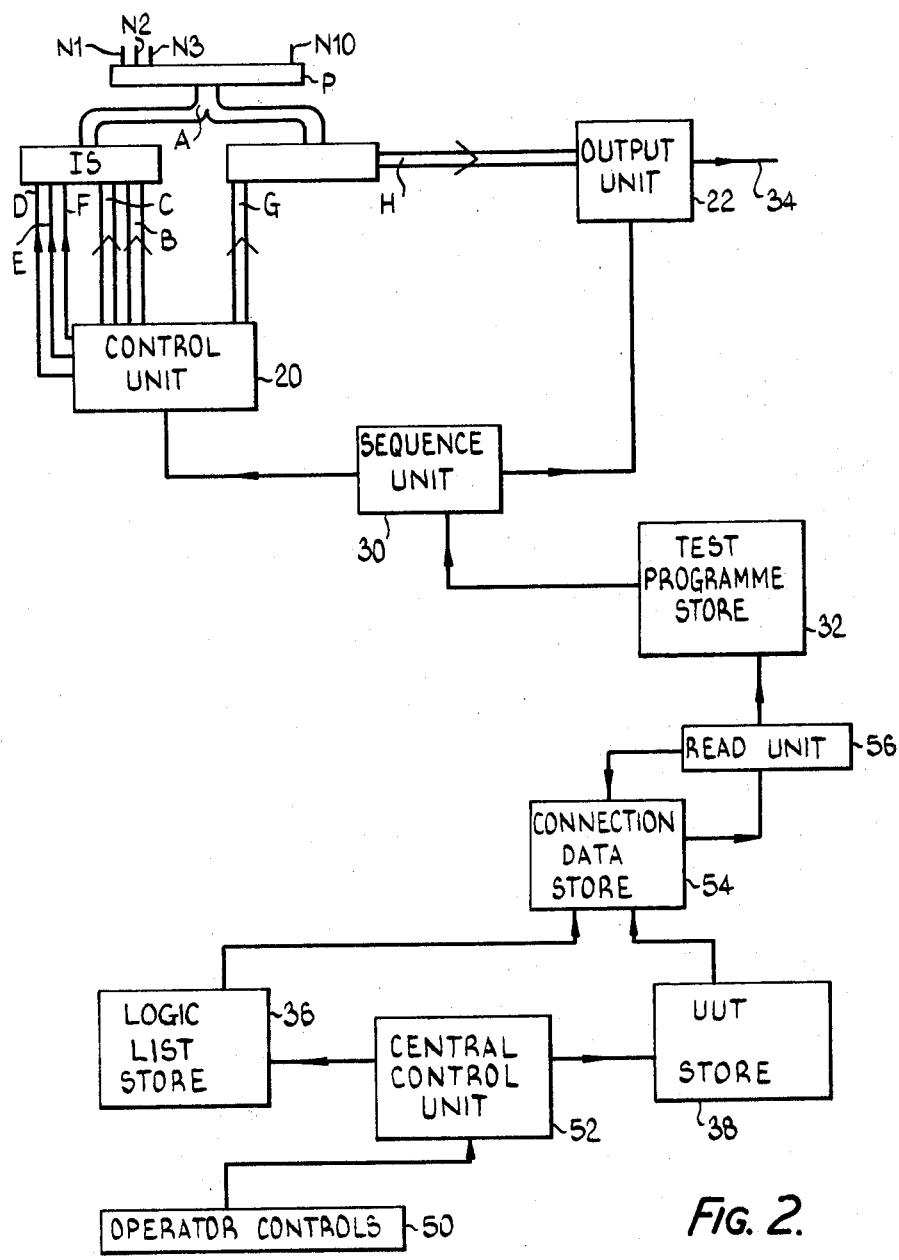
FIG. 2 is a block circuit diagram of the apparatus.

FIG. 2 shows diagrammatically how the test control unit 20 is itself controlled in accordance with pre-stored test information.

FIG. 2 shows the plate P carrying the test needles N1, N2 ... N10. The input switches IS1, IS2 ... IS10 and the output switches OS1, OS2 ... OS10 are shown diagrammatically by the blocks 26 and 28, and the lines A1, A2 ... A10 connecting them to the contact needles are not shown individually but by means of the channel A. Similarly, the lines B1, B2 ... B10, C1, C2 ... C10 and G1, G2 ... G10 from the central control unit 20 to the input switches IS and the output switches OS are not shown individually but as channels B, C and G. Finally, the output lines H1, H2 ... H10 to the output unit 22 are shown as a channel H.

The system includes a sequence control unit 30 which operates under control of information in a store 32. In a manner to be explained, the system produces in the store 32, in response to input information identifying the circuit to be tested and to pre-stored information relating to that type of logic circuit, a test programme or a set of control instructions which in turn controls the sequence unit 30. In response to these instructions, the sequence unit 30 causes the input control unit 20 to apply specific binary levels to particular ones of the needles N1, N2 ... N10 and to feed the resultant binary outputs sensed by other ones of the needles to the output unit 22. In the output unit 22, these binary outputs are compared with data which represents the outputs which should be produced by a fault-free logic circuit and which is passed to the output unit 22 from the store 32 via the sequence unit 30. As a result of this comparison, the output unit 22 produces an output on a line 34 identifying the particular test just carried out on the logic circuit and whether or not a fault has been detected.

The store 32 then causes the input control unit 20 to carry out a second test on the logic circuit by energising other ones of the needles, and the resultant outputs are compared in the output unit 22 with fresh data from the store 32. Again, the output unit 20 produces the test result on line 34.

This procedure is repeated until the full range of tests prescribed for that logic circuit have been carried out.

The manner in which the system produces the test programme stored in the store 32 will now be described.

The system includes a store 36 storing data comprising, for each of the logic circuit types which the system is to be capable of testing, a respective basic Logic List. Each Logic List is a list of logic states which define the operation of one type of logic circuit. Therefore, each such logic state identifies one or more particular terminals of the logic circuit, specifies the binary levels which are to be applied to them, identifies a further terminal or terminals of the logic circuit and specifies the binary levels which should be output there if the logic circuit is operating correctly. In addition, the Logic List identifies which terminals of the circuit are the supply terminals.

The system also has a "unit under test" or UUT store 38 which stores connection information, or a UUT programme, relating to all of a number of specific logic circuits to be tested (e.g. all the logic circuits making up a complete circuit board). Thus, the store 38 will store, for a particular logic circuit (forming part of a complete circuit board for example), information identifying the logic circuit type and specifying how its terminals are physically arranged in relation to the needles N1, N2 ..

N10 of the plate P. In other words, the stored information (the UUT programme) will specify which test needle will be in contact with terminal T1 of the logic circuit, which test needle will be in contact with terminal T2, and so on for the remaining circuit terminals, when the plate P is brought up into position on the circuit board.

In a manner now to be explained in more detail, the system uses the information in the stores 36 and 38 to construct the test programme for the store 32.

The system is not normally able to construct the test programme merely by reading out the relevant Logic List and simply converting each terminal number from the UUT programme into the corresponding test needle number and then storing the result in the store 32. This is because the store 36 stores only the basic Logic List for each type of logic circuit—and any particular logic circuit to be tested may and usually will have been operationally modified by the circuit designer in order to give it a specific function, for example by connecting certain of its terminals together and/or to a fixed potential level. Such modifications alter the Logic List applicable to the logic circuit, and this means that the basic Logic List extracted from the store 36 will not be completely applicable to the modified logic circuit. The system therefore has to read out the Logic List for the particular logic circuit type and then modify it not only by correlating the identities of the terminals of the logic circuit with the identities of the test needles to which those terminals will be connected during the test, but also to take into account the particular manner in which the external conditions applied to that logic circuit modify its logical operation. This facility enables the system to test a very large number of applications of basic logic circuit types and yet requires it to store only the basic Logic List for each logic circuit type.

The system includes operator controls 50 by means of which the operator can identify the circuit board being tested. The operator controls 50 activate a central control unit 52 which causes the store 38 to read out the part of the programme relevant to the first logic circuit to be tested on that board, that is, data correlating the terminals on the logic circuit with the particular test needles on the plate P which are in contact with those terminals. This read-out data is stored in a store 54. Store 54 will therefore store the terminal numbers in numerical order and, for each terminal, will also store the number of the corresponding test needle. Where two or more of the terminals of the logic circuit are in fact connected together in the particular arrangement under test, the data stored in the store 38, and thus the data read out into the store 54, will associate each of these terminals with the same one of the test needles (because, clearly, only one input switch IS or one output switch OS need be operated in order to input or output binary signals from both or all of the interconnected terminals). If in the particular arrangement under test, particular terminals of the logic circuit are held at fixed supply potentials, corresponding to binary HIGH or binary LOW levels, then this information is also held in the UUT programme. Finally, any terminal disconnected in the logic circuit under test is not allocated a test needle number in the UUT programme. From the resultant list of test needle identities, therefore, the system is able to determine which of the terminals are connected together, which are held at a fixed supply potential corresponding to a binary HIGH level, which are held at a fixed supply potential corresponding to a binary LOW level, and which are disconnected, and this information is also stored in the store 54.

The central control unit 52 then starts to read out from the store 36 the Logic List relating to the logic circuit type under test. As explained, the Logic List consists of a list of logic states, and the data relating to the first of these states is read out from the store 36, identifying the binary levels to be applied to particular terminals of the logic circuit and the resultant binary levels which should be produced at one or more other terminals. The data read out from the store 36 for the first logic state is then compared with the data in the store 54 so as, first, to convert the terminal identities into the corresponding test needle identities and, secondly, to take into account any interconnections between the terminals of the logic circuit under test, any external connections to fixed supply potentials and any non-connections. Thus, for example, if one of the logic states in the Logic List requires two different binary levels to be applied to two terminals to the logic circuit which, in fact, are connected together in the logic circuit under test, then clearly that particular logic state cannot exist, and this will be determined by the comparison referred to. Similarly, if a particular logic state requires one of the terminals to be set to a binary HIGH but it is in fact connected to a fixed supply potential holding it at a binary LOW in the particular logic circuit under test, then that particular logic state cannot exist either, and again this will be determined by the comparison referred to. The data relating to those logic states which can be carried out is fed into the store 32 to become part of the test programme.

When the full test programme has been set up in this way in the store 32, the sequence unit 30 can then apply the actual logic states to the logic circuit.

It is not necessary for the actual logic states to be applied immediately. Thus, the store 32 could take any suitable form (e.g. a disc store) enabling its data to be generated in the manner explained and stored ready for use subsequently in conjunction with the actual test equipment. The latter could then be completely separate but would have an appropriate data input to read out the test information when the actual logic states were to be applied.

The operation of the system will now be described in more detail with specific reference to a particular example.

Figure 3:
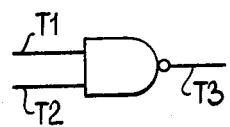
FIG. 3 is a circuit diagram of a particular type of logic circuit which can be tested by the apparatus.
Figure 3:
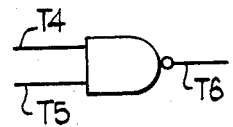

FIG. 3 shows the circuit diagram of a particular logic circuit, consisting in this case of four two-input NAND gates. The fourteen terminals T1, T2 . . . T14 are identified on the NAND gates in the Figure, including terminals T7 (the OV supply potential, corresponding to binary LOW) and T14 (the +V supply potential, corresponding to binary HIGH). TABLE A below is the Logic List for the logic circuit. In the Logic List, sixteen logic states are listed, four for each of the gates. Each logic state identifies the terminals involved and indicates in brackets the binary levels (H for binary HIGH, L for binary LOW) to be applied to two of the terminals and the binary level to be produced by the third terminal (if the logic circuit is operating correctly).

TABLE A

| Logic State No. | Inputs | Outputs |
|---|---|---|
| 1 | T1(H), T2(H) | T3(L) |
| 2 | T1(L), T2(H) | T3(H) |

TABLE A-continued

| Logic State No. | Inputs | Outputs |
| --- | --- | --- |
| 3 | T1(L), T2(L) | T3(H) |
| 4 | T1(H), T2(L) | T3(H) |
| 5 | T4(H), T5(H) | T6(L) |
| 6 | T4(L), T5(H) | T6(H) |
| 7 | T4(L), T5(L) | T6(H) |
| 8 | T4(H), T5(L) | T6(H) |
| 9 | T9(H), T10(H) | T8(L) |
| 10 | T9(L), T10(H) | T8(H) |
| 11 | T9(L), T10(L) | T8(H) |
| 12 | T9(H), T10(L) | T8(H) |
| 13 | T12(H), T13(H) | T11(L) |
| 14 | T12(L), T13(H) | T11(H) |
| 15 | T12(L), T13(L) | T11(H) |
| 16 | T12(H), T13(L) | T11(H) |
| Power supplies:- T7 OV; T14 +V. | | |

Figure 4:
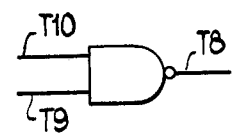
FIG. 4 is a circuit diagram showing the logic circuit of FIG. 3 connected to other circuitry and showing how test needles of the apparatus contact its terminals.
Figure 4:
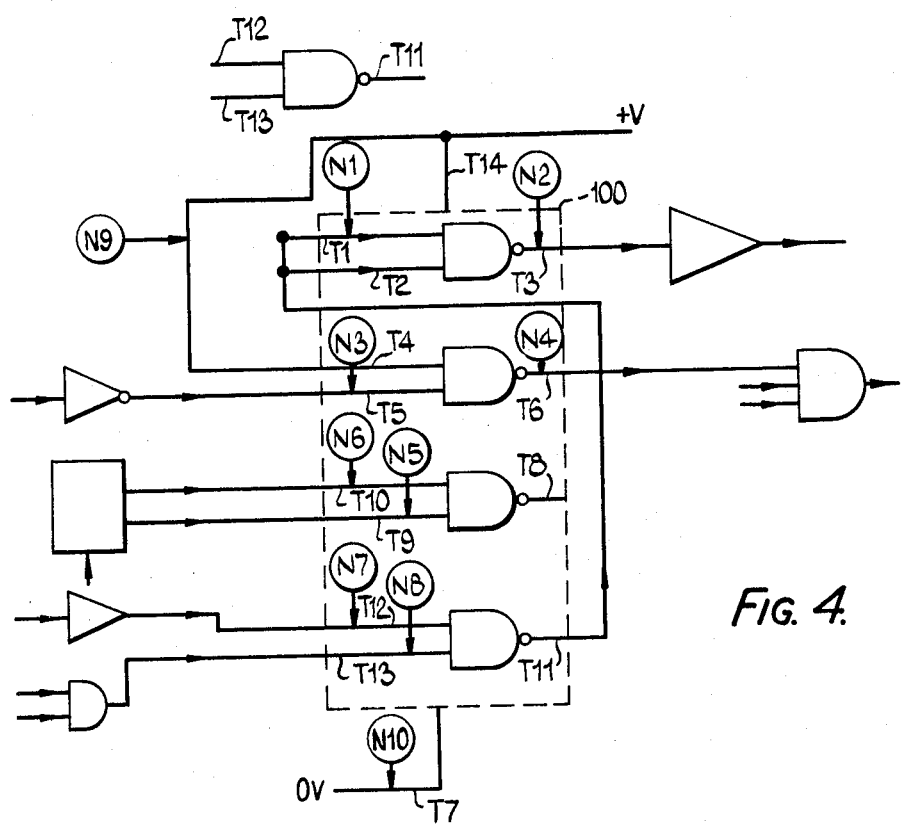

By way of comparison, FIG. 4 shows a logic circuit of the type shown in FIG. 3 but actually connected in a circuit board. The logic circuit is shown enclosed in the chain dotted line 100. The test needles which come into contact with the various terminals are identified in the circles in FIG. 4. TABLE B below is therefore part of the UUT test programme stored in store 38 (FIG. 2). This shows for each of the terminals T1, T2 . . . T14 of the logic circuit under test the identity of the corresponding test needle N1, N2 . . . N10 to which it is connected. Where a terminal (T8 in this example) is completely disconnected, the UUT test programme stores "NO" (as there is no needle actually connected to that terminal). Where a terminal (e.g. T4) is held at the fixed supply potential corresponding to a binary HIGH in the actual circuit under test, or where a terminal is held at the fixed supply potential corresponding to a binary LOW in the actual circuit, the terminal will share the same needle number as specified for the supply terminal permanently connected to that potential; thus T4 and T14 will share the same needle number in this example. In this way, the UUT test programme identifies which terminals are unconnected and which are held at specified binary levels.

TABLE B

| Terminal I | Test needle identity as stored in UUT programme II |
| --- | --- |
| T1 | N1 |
| T2 | N1 |
| T3 | N2 |
| T4 | N9 |
| T5 | N3 |
| T6 | N4 |
| T7 | N10 |
| T8 | NO |
| T9 | N5 |
| T10 | N6 |
| T11 | N1 |
| T12 | N7 |
| T13 | N8 |
| T14 | N9 |

As explained, the appropriate part (in the form of TABLE B above) of the UUT test programme is read out from the store 38 into the store 54 to form part of a TABLE C as follows. (TABLE C will be repeated several times, either in whole or in part, and each repetition will be identified as TABLE C/1, TABLE C/2 . . . Where only part of the TABLE is repeated, this part will be identified by reference to the row and column numbers of the TABLE. The same applies to TABLE D and TABLE E which occur later).

TABLE C/1

| I | II | III | IV | V | VI |
| --- | --- | --- | --- | --- | --- |
| Row No. | Terminal | Test needle | Special conditions | Last state | Required next state |
| I | T1 | N1 | | | |
| II | T2 | N1 | | | |
| III | T3 | N2 | | | |
| IV | T4 | N9 | | | |
| V | T5 | N3 | | | |
| VI | T6 | N4 | | | |
| VII | T7 | N10 | | | |
| VIII | T8 | NO | | | |
| IX | T9 | N5 | | | |
| X | T10 | N6 | | | |
| XI | T11 | N1 | | | |
| XII | T12 | N7 | | | |
| XIII | T13 | N8 | | | |
| XIV | T14 | N9 | | | |

The read-out unit 56 (FIG. 2) then reads out each entry in Column III of TABLE C in turn and compares this with the remaining data of Column III looking for any other entries with the same identity. If any are found, then the read-out unit 56 stores in the store 54 a symbol ("LI") to indicate that the particular test needle listed in Column III is linked to at least one other test needle. Similarly, during this process, the read-out unit 56 tests to ascertain whether the test needle identity read out is "NO". If it is, then the read-out unit 56 stores a symbol "NC" in the store 54 to indicate that the particular needle in Column III is not connected. The central control unit 52 then reads out the information stored in the Logic List store 36 which specifies which of the terminals of the logic circuit under test are its supply terminals. The read-out unit 56 then identifies which terminals (e.g. T4) are connected to the supply terminals and annotates each needle with the symbol "TH" or "TL" according to whether it is held at binary HIGH or binary LOW by the supply. In this way, the read-out unit 56 constructs a fourth column, Column IV, of Table C, which in the particular example being considered, therefore has the form:

TABLE C/2

| I | II | III | IV |
| --- | --- | --- | --- |
| Row No. | Terminal | Test needle | Special conditions |
| I | T1 | N1 | LI |
| II | T2 | N1 | LI |
| III | T3 | N2 | — |
| IV | T4 | N9 | TH |
| V | T5 | N3 | — |
| VI | T6 | N4 | — |
| VII | T7 | N10 | TL |
| VIII | T8 | NO | NC |
| IX | T9 | N5 | — |
| X | T10 | N6 | — |
| XI | T11 | N1 | LI |
| XII | T12 | N7 | — |
| XIII | T13 | N8 | — |
| XIV | T14 | N9 | TH |

The central control unit 52 then reads out the logic states of the Logic List, TABLE A, one by one, and compares them with the information in the store 54 so as to produce the test programme for storage in the store 32. This process involves the construction of two more columns, Columns V and VI for the TABLE C in the store 54 as will now be explained.

Column V lists for each of the test needles identified in Column III the last state of that needle—that is, its state (whether at a binary HIGH level, a binary LOW level or connected to read a binary output from the logic circuit) during the immediately preceding logic test. Column VI lists the new state required for that needle during the logic state to be applied.

Initially, therefore, Columns V and VI will be empty.

As shown in Table A, the first logic state of the Logic List requires terminals T1 and T2 to be held at a binary HIGH level and terminal T3 to produce the output (which should be binary LOW). The central control unit 52 therefore enters this information into Column VI of Table C as follows:

TABLE C/3

| I Row No. | II Terminal | III Test needle | IV Special conditions | V Last state | VI Required next state |
|---|---|---|---|---|---|
| I | T1 | N1 | LI | | H |
| II | T2 | N1 | LI | | H |
| III | T3 | N2 | — | | OP(L) |
| . | . | . | . | . | . |
| . | . | . | . | . | . |

The symbol "OP(L)" indicates that the particular needle is required to be an output needle and the expected logic level is LOW; similarly "OP(H)" indicates that the particular needle is required to be an output needle and the expected logic level is HIGH.

In feeding the information into the store 54 to produce the Column VI, the central control unit 52 checks the associated information in Column IV—from which the symbols "LI" indicate that terminals T1 and T2 are linked. However, because the logic state requires both terminals to be held at the same binary level (H), this is a possible condition.

From the information in Columns III and VI of Table C/3, the central control unit 52 is therefore able to construct the test data for the first test (Test No. 1), that is, the first logic state applicable to the particular logic circuit under test, and this is entered into the store 32. Store 32 stores the actual test programme (e.g. in the form of mnemonic codes) which can be represented in the form of a Table D of which the first row is therefore as follows:

TABLE D/1

| I Row No. | II Test No. | III Inputs | IV Outputs |
|---|---|---|---|
| I | 1 | NI(H) | N2(L) |
| . | . | . | . |
| . | . | . | . |

The central control unit 52 then transfers the information from Column VI of Table C/3 in store 54 into Column V and reads out the second logic state from the Logic List (TABLE A) into Column VI. This produces TABLE C/4 as follows:

TABLE C/4

| I Row No. | II Terminal | III Test needle | IV Special conditions | V Last state | VI Required next state |
|---|---|---|---|---|---|
| I | T1 | N1 | LI | H | L |
| II | T2 | N1 | LI | H | H |
| III | T3 | N2 | — | OP(L) | OP(H) |
| . | . | . | . | . | . |

TABLE C/4-continued

| I Row No. | II Terminal | III Test needle | IV Special conditions | V Last state | VI Required next state |
|---|---|---|---|---|---|
| . | . | . | . | . | . |
| . | . | . | . | . | . |

The central control unit 52 then compares the data in Column VI with that in Columns IV and V. This comparison indicates that terminals T1 and T2 are required to be at two different binary levels. Therefore, this logic state cannot exist because both terminals are connected together in the circuit board. Therefore, no corresponding entry is made in store 32 and Column V is left unchanged. The central control unit 52 now reads out the third logic state from the Logic List TABLE A, in the store 36 and places it in Column VI of Table C as follows:

TABLE C/5

| I Row No. | II Terminal | III Test needle | IV Special conditions | V Last state | VI Required next state |
|---|---|---|---|---|---|
| I | T1 | N1 | LI | H | L |
| II | T2 | N1 | LI | H | L |
| III | T3 | N2 | — | OP(L) | OP(H) |
| . | . | . | . | . | . |
| . | . | . | . | . | . |

Once more, the central control unit 52 compares the information in the various Columns of Store 54. This binary comparison shows that needle N1 is to be held at a binary LOW level. This logic state is therefore clearly possible, and the central control unit 52 feeds the test data for this logic state into the store 32, producing more mnemonic codes for the test programme in that store which can be represented by a second row for the Table D in that store, as follows:

TABLE D/2

| I Row No. | II Test No. | III Inputs | IV Outputs |
|---|---|---|---|
| I | 1 | N1(H) | N2(L) |
| II | 2 | N1(L) | N2(H) |
| . | . | . | . |
| . | . | . | . |

At the same time, it transfers the information from Column VI to Column V of Table C/5 and reads out the fourth logic state from the Truth Table in store 36 and places this data into Column VI of Table C in store 54, as follows:

TABLE C/6

| I Row No. | II Terminal | III Test Needle | IV Special conditions | V Last state | VI Required next state |
|---|---|---|---|---|---|
| I | T1 | N1 | LI | L | H |
| II | T2 | N1 | LI | L | L |
| III | T3 | N2 | — | OP(H) | OP(H) |
| . | . | . | . | . | . |
| . | . | . | . | . | . |

The central control unit 52 will then immediately determine that this logic state is not possible, because it would require the two linked terminals T1 and T2 to be at different binary levels. Therefore, no entry is made in the store 32 and Column V is left unchanged, and the central control unit 52 reads out the fifth logic state from the Logic List in store 36 and enters this information into Column VI of Table C in store 54 as follows:

TABLE C/7

| I Row No. | II Terminal | III Test needle | IV Special conditions | V Last state | VI Required next state |
|---|---|---|---|---|---|
| I | T1 | N1 | | LI | L |
| II | T2 | N1 | | LI | L |
| III | T3 | N2 | | — | OP(H) |
| IV | T4 | N9 | | TH | H |
| V | T5 | N3 | | — | H |
| VI | T6 | N4 | | — | OP(L) |
| . | . | . | | . | . |

The central control unit 52 now compares the information in the various Columns of Table C and will therefore determine that this test can be carried out. Although terminal T4 is tied to a positive supply potential, the logic state of this test is possible because it requires the terminal to be at that level. Therefore, the unit 52 enters the test date into Table D in the store 32 as follows:

TABLE D/3

| I Row No. | II Test No. | III Inputs | IV Outputs |
|---|---|---|---|
| I | 1 | N1(H) | N2(L) |
| II | 2 | N1(L) | N2(H) |
| III | 3 | N3(H) | N4(L) |
| . | . | . | . |

The central control unit 52 now transfers the information in Column VI of Table C/7 to Column V and reads out the sixth logic state from the Logic List in store 36 into Column VI, as follows:

TABLE C/8

| I Row No. | II Terminal | III Test needle | IV Special conditions | V Last state | VI Required next state |
|---|---|---|---|---|---|
| I | T1 | N1 | — | LI | L |
| II | T2 | N1 | — | LI | L |
| III | T3 | N2 | — | — | OP(H) |
| IV | T4 | N9 | TH | H | L |
| V | T5 | N3 | — | H | H |
| VI | T6 | N4 | — | OP(L) | OP(H) |
| . | . | . | . | . | . |

The central control unit 52 will determine that this logic state is not possible, because it requires terminal T4 to be held at binary LOW level—whereas this terminal is in fact tied to a binary HIGH level. No corresponding entry is therefore made in store 32. The same applies to the seventh logic state from the Logic List.

The eighth logic state from the Logic List store 36 is now read into Column VI of Table C as follows:

TABLE C/9

| I Row No. | II Terminal | III Test needle | IV Special conditions | V Last state | VI Required next state |
|---|---|---|---|---|---|
| I | T1 | N1 | — | LI | L |

TABLE C/9-continued

| I Row No. | II Terminal | III Test needle | IV Special conditions | V Last state | VI Required next state |
|---|---|---|---|---|---|
| II | T2 | N1 | — | LI | L |
| III | T3 | N2 | — | — | OP(H) |
| IV | T4 | N9 | TH | H | H |
| V | T5 | N3 | — | H | L |
| VI | T6 | N4 | — | OP(L) | OP(H) |
| . | . | . | . | . | . |

The central control unit 52 will determine that this logic state is possible, and a corresponding entry is therefore made in store 32 as follows:

TABLE D/4

| I Row No. | II Test No. | III Inputs | IV Outputs |
|---|---|---|---|
| I | 1 | N1(H) | N2(L) |
| II | 2 | N1(L) | N2(H) |
| III | 3 | N3(H) | N4(L) |
| IV | 4 | N3(L) | N4(H) |
| . | . | . | . |

The central control unit 52 now reads out the ninth logic state from the Logic List in store 36 into Column VI of Table C/9 and transfers the information previously in Column VI to Column V as follows:

TABLE C/10

| I Row No. | II Terminal | III Test needle | IV Special conditions | V Last state | VI Required next state |
|---|---|---|---|---|---|
| I | T1 | N1 | | LI | L |
| II | T2 | N1 | | LI | L |
| III | T3 | N2 | | — | OP(H) |
| IV | T4 | N9 | TH | H | |
| V | T5 | N3 | | — | H |
| VI | T6 | N4 | | — | OP(L) |
| VII | T7 | N10 | TL | | |
| VIII | T8 | N0 | NC | | OP(L) |
| IX | T9 | N5 | | — | H |
| X | T10 | N6 | | — | H |

The central control unit 52 will determine that the binary binary output on terminal 8 cannot be measured because Column IV indicates that it is not connected (NC). However, the central control unit will still feed the input test data for this logic state into the store 32, because the inputs could affect the subsequent logic states, but no output data is fed into store 32.

This process continues in the same general manner and will not be further described. At the completion of the process, the mnemonic codes of the test programme in store 32 will represent the following information:

TABLE D/5

| I Row No. | II Test No. | III Inputs | IV Outputs |
|---|---|---|---|
| I | 1 | N1(H) | N2(L) |
| II | 2 | N1(L) | N2(H) |
| III | 3 | N3(H) | N4(L) |
| IV | 4 | N3(L) | N4(H) |
| V | 5 | N5(H),N6(H) | — |
| VI | 6 | N5(L),N6(H) | — |
| VII | 7 | N5(L),N6(L) | — |
| VIII | 8 | N5(H),N6(L) | — |
| IX | 9 | N7(H),N8(H) | N1(L) |
| X | 10 | N7(L),N8(H) | N1(H) |
| XI | 11 | N7(L),N8(L) | N1(H) |

TABLE D/5-continued

| I Row No. | II Test No. | III Inputs | IV Outputs |
|---|---|---|---|
| XII | 12 | N7(H),N8(L) | N1(H) |

In the manner described, this data can then be used, either immediately or at some subsequent time, to cause the test equipment to carry out the tests.

To simplify the operation of the system, the sequence unit 30 (FIG. 2) may be arranged so that in response to data representing a new logic test on a particular circuit, it maintains the conditions applied during the immediately preceding test unless instructed otherwise. This means, therefore, that the information stored in store 32 (Table D) only needs a new entry when the required state (binary HIGH, binary LOW or output data) is different from the state applicable to a particular test needle during the immediately preceding test. The process described above can be applied to the testing of all types and complexities of logic circuits and the particular type shown is purely by way of example.

Figure 5:
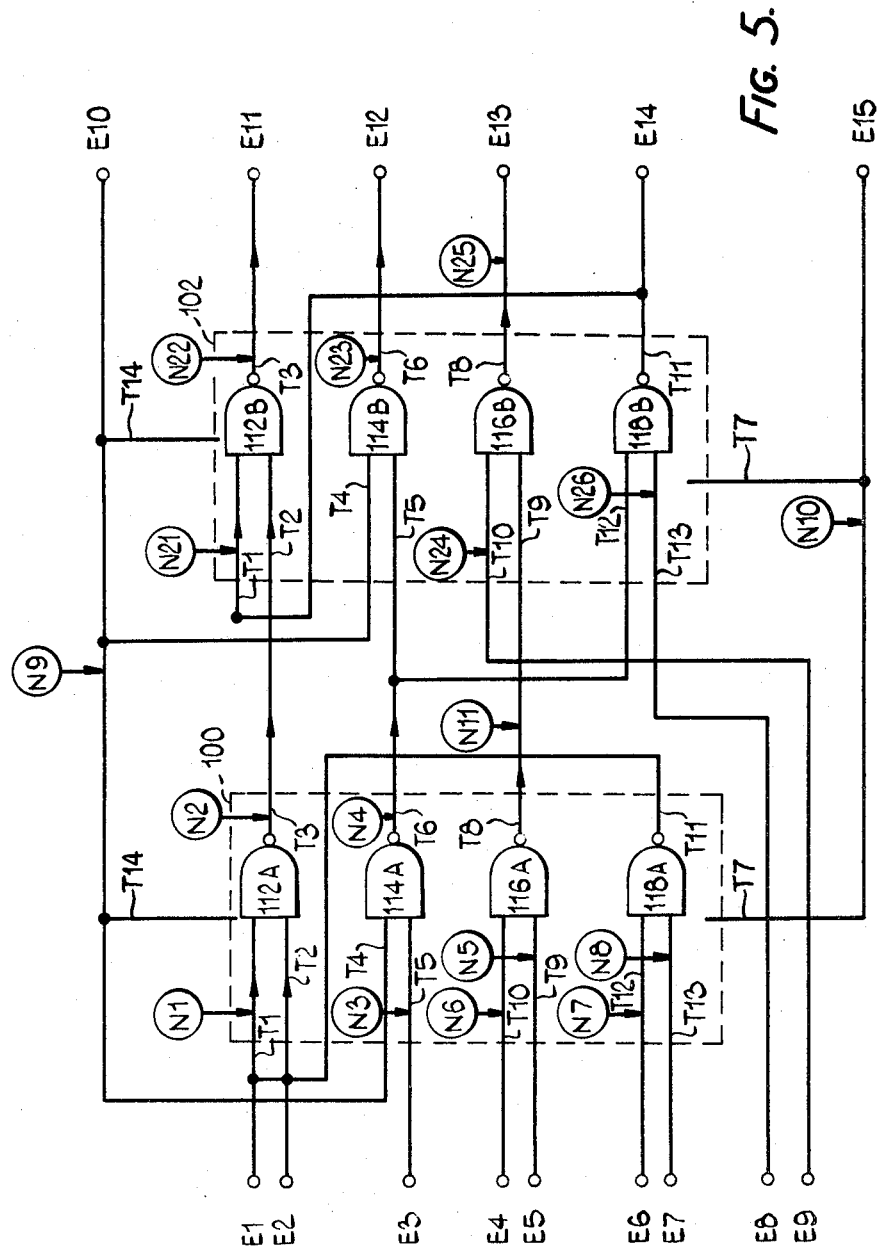
FIG. 5 is a circuit diagram showing two of the logic circuits of FIG. 3 connected together to illustrate how the apparatus and methods may be applied to the testing of a circuit board via its edge connections.

FIG. 5 is to illustrate how the apparatus already described can be used not only to develop a test programme for testing an individual logic circuit in a circuit board but also to generate the codes of a complete test programme for testing the entire board by means of its edge connectors. By way of example, FIG. 5 shows two logic circuits, each of the form shown in FIG. 4, which are connected together and, for the sake of simplicity, are assumed to constitute a complete circuit board (though in practice, of course, a complete circuit board would normally comprise many logic circuits). As shown in FIG. 5, one of the logic circuits is referenced 100 and the other 102, and FIG. 5 also shows the edge connectors E1 to E15.

In operation, the apparatus already described would initially consider each of the two logic circuits 100, 102 separately and would perform the above-described procedure on each of them individually, that is, it would generate the codes of the test programme for each of the logic circuits separately as if each were to be tested in circuit in the board. However, this procedure would be carried out assigning imaginary or notional test needle numbers to the various terminals of each logic circuit. This is because the aim is to test the board as a whole, using its edge connectors, rather than to test each logic circuit separately, in the board, and there is therefore no need actually to apply the test needles to the logic circuit. On the other hand, the assignment of the imaginary or notional test needle numbers to each terminal is a convenient way of indicating to the apparatus the various interconnections affecting each logic circuit and enables the apparatus already described to be conveniently used with the same UUT programme as used for the in-circuit tests of the individual logic circuits, plus only a definition specifying which needle is connected to each edge connector.

Figure 6:
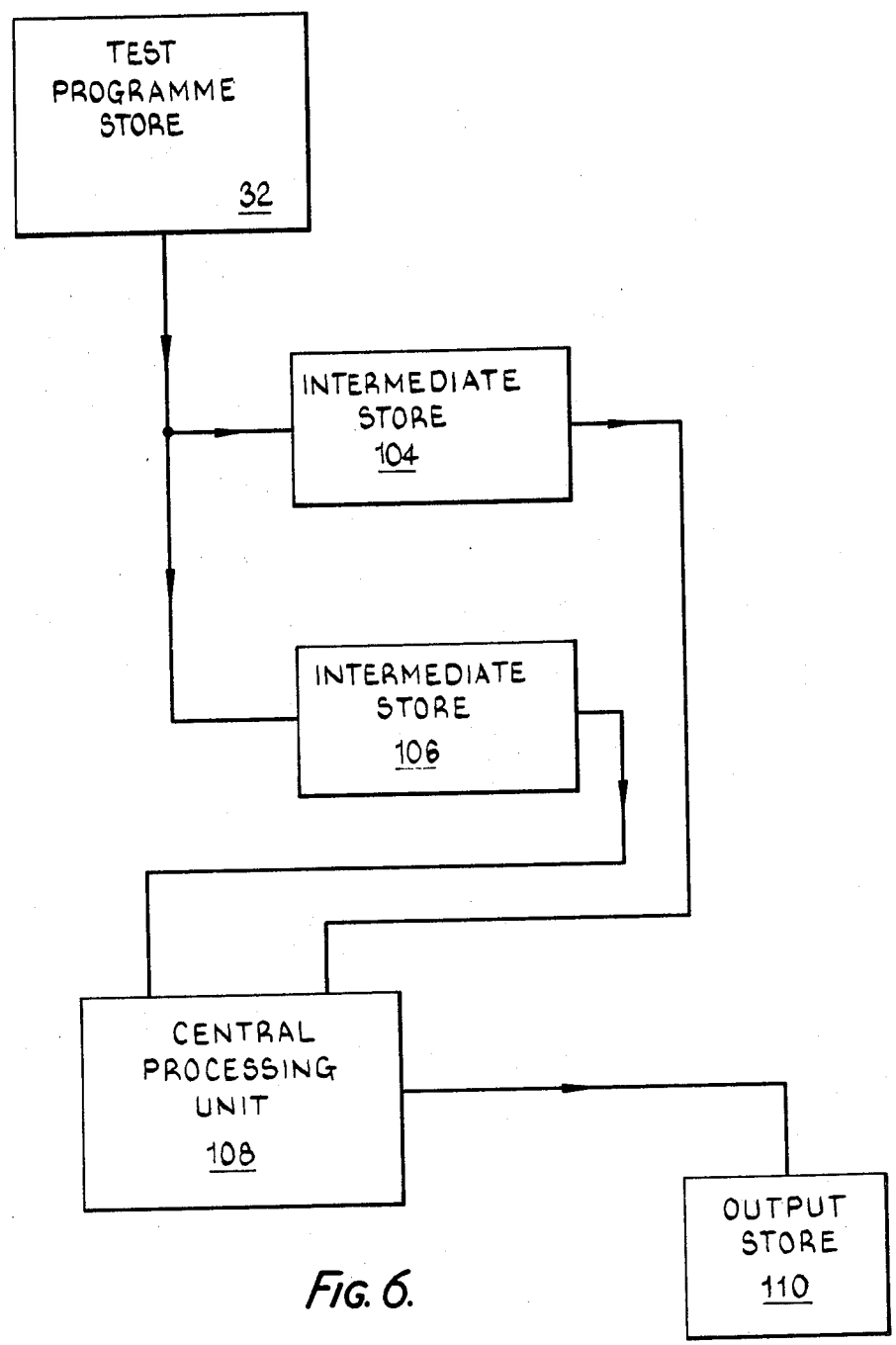
FIG. 6 is a block diagram showing modifications to the apparatus to enable the testing of a circuit board via its edge connections.

After the test programme for each of the two logic circuits has been produced in this way, each test programme will be stored in the store 32 of FIG. 2. Each test programme may be in the form of mnemonic codes but each can be represented as a table of the same form as (though of course not identical with) Table D/5. As shown in FIG. 6, the apparatus then reads out each of the two test programmes into a respective one of two intermediate stores 104 and 106. The apparatus includes a processing unit 108 which then considers, in turn, each of the logic states applicable to logic circuit 102 and therefore reads the codes relative to each of these logic states from the store 106.

The processing unit 108 then considers the required input conditions for the first of the logic states applicable to logic circuit 102 and determines, by reference to the information in the store 104, the necessary outputs which are required from the logic circuit 100. Following this, the processing unit 108 then determines the necessary input conditions required in the logic circuit 100 in order to produce those output conditions.

Having thus determined the required input conditions to the logic circuit 100 for producing a particular output condition of the logic circuit 102, the processing unit 108 can convert this information into information in terms of the identities of the edge connectors E1 to E15. This information is then fed into an output store 110 and therefore represents an edge connector test programme; that is, a programme defining a series of tests each of which requires particular binary inputs to be applied to certain of the edge connectors and defines other edge connectors at which a resultant output or outputs should be produced and the binary level of that output or those outputs.

A specific example will now be considered.

The processing unit 108 begins by searching for a test needle specified in store 106 as producing an output condition and which is also connected to an edge connector. For example, one of the entries in store 106 for gate 112B of logic circuit 102 will be as follows:

TABLE E/1

| Input conditions | Output conditions |
|---|---|
| N21(H), N2(H) | N22(L) |

This information will be read out of the store 106 by the processing unit 108, which will recognise that needle N22 is connected to an edge connector (E11). The unit 108 will individually consider all the input conditions of this entry in Table E/1.

First, therefore, it will consider the input condition N21(H), and will look for an output condition producing N21(H). Specifically, the processing unit 108 will determine that store 106 is storing an entry (relating to a particular logic state of gate 118B) as follows:

TABLE E/2

| Input conditions | Output conditions |
|---|---|
| N4(L), N26(L) | N21(H) |

Therefore, the processing unit 108 can substitute for N21(H), in Table E/1, the following, that is, N4(L), N26 (L), so as to produce

TABLE E/3

| Input conditions | Output conditions |
|---|---|
| N4(L), N26(L), N2(H) | N22(L) |

The processing unit now recognises that N26 is connected to an edge connector (E8) and need not be further considered. It now considers the test programme stored in the store 104 in order to determine the input conditions necessary to provide N4(L), and will recognise that one of the logic states applicable to gate 114A will be as follows:

TABLE E/4

| Input conditions | Output conditions |
| --- | --- |
| N3(H), N9(H) | N4(L) |

The processing unit therefore substitutes N3(H), N9(H) for N4(L) in Table E/3, to produce:

TABLE E/5

| Input conditions | Output conditions |
| --- | --- |
| N3(H), N9(H), N26(L), N2(H) | N22(L) |

The processing unit 108 now recognises that needles N3 and N9 are both connected to edge connectors (E3 and E10), as well as N26, and will now consider the second of the input conditions in Table E/1, that is, N2(H). More specifically, the processing unit 108 considers the conditions in logic circuit 100 which give rise to N2(H) and will recognise that one of the logic states applied to gate 112A is:

TABLE E/6

| Input conditions | Output conditions |
| --- | --- |
| N1(L) | N2(H) |

Therefore, the processing unit 108 substitutes N1(L) for N2(H).

The processing unit 108 has therefore re-written Table E/1 as follows:

TABLE E/7

| Input conditions | Output conditions |
| --- | --- |
| N3(H), N9(H), N26(L), N1(L) | N22(L) |

The processing unit 108 now recognises that test needle N1 is connected to an edge connector (E1) and can now convert Table E/7 into a Table, Table F, expressed in terms of edge connectors rather than test needles, as follows:

TABLE F

| Input conditions | Output conditions |
| --- | --- |
| E3(H), E10(H), E8(L), E1(L) | E11(L) |

The processing unit 108 will therefore store in the store 110 the mnemonic codes representing the information in Table F. This information of course represents only one of the many logic tests to be carried out on the complete circuit board—and in fact only one of the several logic tests which would all produce the condition E12(L).

What is claimed is:

1. A system for generating test data for testing any one of a plurality of logic circuits, comprising
a store storing for each of the basic logic circuit types data in the form of a respective list of logic states each logic state identifying one or more particular terminals of the logic circuit to which specified data inputs are to be applied and one or more particular terminals at which specified data outputs are to be produced if the logic circuit is operating correctly,
means generating connection information relating to a particular logic circuit (of one of the basic types) to be tested and specifying any external conditions applied to that circuit by means of its terminals, and
modifying means operative to modify the logic states in the stored list for that logic circuit in dependence on the connection information whereby to produce the said test data.

2. A system according to claim 1, in which the data inputs and outputs are binary levels.

3. A system according to claim 1 or 2, including a base carrying a plurality of test needles physically arranged in a predetermined manner and by means of which data inputs can be applied to particular terminals of a logic circuit to be tested and by means of which any resultant data outputs of the logic circuit can be detected.

4. A system according to claim 3, in which
the store comprises means for storing the data inputs and the data outputs in relation to the particular terminals of the logic circuit to which they are to be applied or at which they are to be produced, and
the means for generating the connection information relating to a particular logic circuit comprises means specifying the particular test needle which will make contact with each terminal of the logic circuit when the test needles are brought into specified juxtaposition with the logic circuit.

5. A system according to claim 4, in which the connection information specifies the same-numbered test needles for each of a plurality of logic circuit terminals which are directly connected together externally of the logic circuit.

6. A system according to claim 5, in which the connection information specifies any particular terminals of the logic circuit which are externally connected to fixed electrical supplies, and thus held fixed at particular levels, or are unconnected, by identifying them in predetermined ways.

7. A system according to claim 6, in which the modifying means comprises
means responsive to a particular logic circuit to be tested to read out the data representing a particular one of the logic states of the stored list applicable to the basic type of logic circuit corresponding to the logic circuit to be tested, and
means for comparing that data with the connection information to determine when the connection information specifies external connections between the terminals involved in the particular logic state which are in conflict with the requirements of that logic state or when the connection information specifies external electrical connections applied to, or non-connections of, any terminal involved in that logic state which are in conflict with the requirements of that logic state, whereby to produce no test data for that logic state.

8. A system according to claim 1, including means connected to compare the modified logic states applicable to each of a plurality of logic circuits interconnected in a circuit board whereby to generate test data identifying the edge connectors of the circuit board to which specified data inputs are to be applied and the corresponding edge connectors at which specified data outputs are to be produced if the circuit board is operating correctly.

9. A system for generating test data for testing any one of a plurality of logic circuits, comprising
a store storing, for each of the basic logic circuit types, data in the form of a respective list of logic states, each logic state identifying one or more particular terminals of the logic circuit to which specified data inputs are to be applied and one or more particular terminals at which specified data outputs are to be produced if the logic circuit is operating correctly, an array of discrete contact means, means mounting the contact means in predetermined physical relationship with each other whereby when the array and a particular logic circuit under test are brought into juxtaposition each discrete contact means makes contact with at least one particular terminal of the logic circuit in dependence on the particular basic type of the logic circuit, means storing, for each particular logic circuit to be tested, connection data which specifies for each particular one of the discrete contact means the identity of the corresponding terminal of the logic circuit and, in addition, the identity of any other terminal of that logic circuit which is also connected to the same discrete contact means by an external connection to that logic circuit, control means operative in response to a particular logic circuit to be tested to read out each logic state of the stored list of logic states corresponding to that basic logic circuit type and to compare each such logic state with the connection data whereby, unless inhibited for any such logic state, to identify the discrete contact means corresponding to the particular terminals specified by that logic state and the data inputs and outputs to be applied to, or produced from, those contact means as specified by that logic state, inhibiting means operative to inhibit the control means when the connection data indicates that two or more terminals of the logic circuit under test are interconnected by an external connection in a manner conflicting with the requirement of a particular logic state, and output means responsive to the said discrete contact means and the data inputs and outputs as identified by the control means to generate the said test data.

10. A system according to claim 9, in which the connection data additionally specifies any particular terminals of each logic circuit to be tested which are externally connected to electrical supplies, and thus held fixed at particular levels, or are unconnected, and in which the inhibiting means is operative to inhibit the said control means when the connection data indicates that any particular terminal of a logic circuit under test is externally connected to an electrical supply, or is unconnected, in a manner conflicting with a requirement of a particular logic state.

* * * * *

UNITED STATES PATENT AND TRADEMARK OFFICE
CERTIFICATE OF CORRECTION

PATENT NO. : 4,365,334
DATED : December 21, 1982
INVENTOR(S) : Smith et al.

It is certified that error appears in the above—identified patent and that said Letters Patent is hereby corrected as shown below:

Column 4, lines 46 and 48, delete "comprising" and insert -- housing --.

Column 10, line 16, a new paragraph should have started with "The central control...".

Column 13, line 43, delete "precedure" and insert -- procedure --.

Signed and Sealed this

Third Day of May 1983

[SEAL]

Attest:

GERALD J. MOSSINGHOFF

Attesting Officer

Commissioner of Patents and Trademarks